(12) United States Patent
Kumar Gupta et al.

(10) Patent No.: US 8,733,872 B2
(45) Date of Patent: May 27, 2014

(54) COMMON BASE LATERAL BIPOLAR JUNCTION TRANSISTOR CIRCUIT FOR AN INKJET PRINT HEAD

(75) Inventors: Rohit Kumar Gupta, Singapore (SG); Adam Ghozeil, Corvalis, OR (US); Bee Ling Peh, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 963 days.

(21) Appl. No.: 12/747,570

(22) PCT Filed: Jan. 28, 2008

(86) PCT No.: PCT/US2008/052164
§ 371 (c)(1),
(2), (4) Date: Jun. 11, 2010

(87) PCT Pub. No.: WO2009/096940
PCT Pub. Date: Aug. 6, 2009

(65) Prior Publication Data
US 2010/0271641 A1    Oct. 28, 2010

(51) Int. Cl.
*B41J 2/045*  (2006.01)

(52) U.S. Cl.
USPC ............................................................. 347/10

(58) Field of Classification Search
USPC ............................................................. 347/10
See application file for complete search history.

(56) References Cited

U.S. PATENT DOCUMENTS

| | | | |
|---|---|---|---|
| 4,695,853 A | 9/1987 | Hackleman et al. | |
| 4,862,197 A | 8/1989 | Stoffel | |
| 5,080,513 A | 1/1992 | Clary | |
| 5,264,874 A | 11/1993 | Matsumoto et al. | |
| 5,273,915 A | 12/1993 | Hwang et al. | |
| 5,609,910 A | 3/1997 | Hackleman | |
| 5,681,764 A | 10/1997 | Hess et al. | |
| 5,782,567 A | 7/1998 | Endo | |
| 5,850,242 A | 12/1998 | Asaba | |
| 6,007,173 A | 12/1999 | Delouise et al. | |
| 6,007,186 A * | 12/1999 | Erni | 347/59 |
| 6,286,924 B1 | 9/2001 | Ahne et al. | |
| 6,547,464 B1 | 4/2003 | Lewis et al. | |
| 6,568,783 B2 | 5/2003 | Hu et al. | |
| 6,672,711 B2 | 1/2004 | Kao | |
| 7,111,920 B2 | 9/2006 | Lee et al. | |
| 2002/0027574 A1 | 3/2002 | Kao | |

(Continued)

FOREIGN PATENT DOCUMENTS

| | | |
|---|---|---|
| EP | 1306222 A2 | 5/2003 |
| GB | 2240951 | 8/1991 |

(Continued)

*Primary Examiner* — Laura Martin

(57) ABSTRACT

A print head circuit of an inkjet printer comprising a plurality of row heating elements arranged in a plurality of rows, a plurality of column heating elements arranged in a plurality of columns, and a plurality of lateral bipolar junction transistors (BJTs), each lateral BJT is connected in between and in series with a corresponding one of the plurality of row heating elements and a corresponding one of the plurality of column heating elements, the plurality of lateral BJTs have common bases, wherein the plurality of row heating elements and the plurality of column heating elements are selectively energized to heat ink in the inkjet printer in a desired pattern for printing media, and wherein each of the plurality of lateral BJTs operates to allow the corresponding row and column heating elements that are connected in series with the lateral BJT to be energized.

10 Claims, 10 Drawing Sheets

(56) References Cited

U.S. PATENT DOCUMENTS

| | | |
|---|---|---|
| 2002/0070989 A1* | 6/2002 | Yang et al. ............... 347/9 |
| 2003/0202023 A1* | 10/2003 | Wang et al. ............... 347/5 |
| 2004/0032464 A1 | 2/2004 | Gonzalez |
| 2004/0046833 A1 | 3/2004 | Gonzalez |
| 2005/0253902 A1 | 11/2005 | Fartasj |
| 2006/0152552 A1 | 7/2006 | Huang et al. |
| 2006/0160318 A1 | 7/2006 | Schulte et al. |

FOREIGN PATENT DOCUMENTS

| | | |
|---|---|---|
| JP | 10105787 A | 4/1998 |
| JP | 2000194905 A | 7/2000 |
| JP | 2002334281 A | 11/2002 |
| TW | 200624968 A | 7/2006 |

* cited by examiner

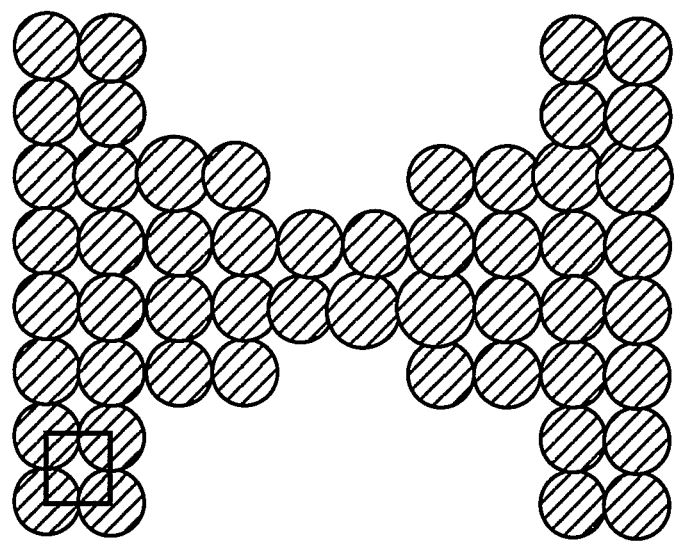

US 8,733,872 B2

COMMON BASE LATERAL BIPOLAR JUNCTION TRANSISTOR CIRCUIT FOR AN INKJET PRINT HEAD

BACKGROUND

A typical inkjet print head contains an ink reservoir, in which the ink completely surrounds an internal heater array that forms a print head circuit. The heater array typically contains multiple heating elements such as thin or thick film resistors, diodes, and/or transistors. The heating elements are arranged in a regular pattern for heating the ink to the boiling point. Each heating element in the heater array can be individually or multiply selected and energized in conjunction with other heating elements to heat the ink in various desired patterns, such as alpha-numeric characters. The boiled ink above the selected heating elements shoots through corresponding apertures in the inkjet print head immediately above the heater array. The ink jet droplets are propelled onto printer paper, or other printing media, where they are recorded in the desired pattern.

FIG. 1 illustrates a typical heater array, or print head circuit, 100 in an inkjet printer. The print head circuit includes multiple row select lines $A_1$ through $A_M$, wherein select lines $A_1$ through $A_3$ are shown, and multiple column select lines $B_1$ through $B_N$, wherein select lines $B_1$ through $B_3$ are shown. Spanning the row and column select lines are heating elements represented as resistors $R_{11}$ through $R_{MN}$, wherein resistors $R_{11}$ through $R_{33}$ are shown, in series with switching elements that are typically metal oxide semiconductor field effect transistors (MOSFETs) $M_{11}$ through $M_{MN}$, wherein MOSFETs $M_{11}$ through $M_{33}$ are shown. The column select lines $B_1$ through $B_N$ are coupled to and selectively energize or fire up the gates of the MOSFETs. No heating current actually flows through the column select lines. The row select lines $A_1$ through $A_M$ are coupled to and selectively provide heating current to the rows of resistors $R_{11}$ through $R_{1N}$, $R_{21}$ through $R_{2N}$, $R_{31}$ through $R_{3N}$, etc. Thus, individual resistors may be selected for high resolution printing by energizing the corresponding row and column select lines. A specific resistor is selected and energized by, for example, by energizing or firing up a row of resistors with a corresponding row select line and energizing or firing up a column select line to energize the gate of the specific resistor (and the gates of other MOSFETs in the column of the specific resistor).

One problem with the print head circuit 100 is the expensive integrated circuit process and design technology that is conventionally used to fabricate such a circuit, which requires individual control of resistors. For example, with the present MOS technology, a minimum of seven semiconductor masks must be used to fabricate the MOSFETs $M_{11}$ through $M_{MN}$, which prolongs and increases the cost of the fabrication process for the print head circuit 100.

Accordingly, there is a desire for a low-cost design of a print head circuit that may be manufactured using a shorter and simpler semiconductor fabrication process for applications which desire fast print speed at lower print quality, such as transactional printing, etc.

BRIEF DESCRIPTION OF THE DRAWINGS

Embodiments are illustrated by way of example and not limited in the following figure(s), in which like numerals indicate like elements, in which:

FIGS. 3A-B illustrate the printing of various patterns by firing multiple heating elements at once in an inkjet printer.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

Described herein are systems and methods for a low cost inkjet print head circuit that uses bipolar junction transistors (BJTs) to enable high speed printing for print jobs that typically do not require high printing resolution or quality or individual firing resistor control. As referred herein, an inkjet printer is a printer that employs an inkjet technology such as thermal inkjet, piezoelectric inkjet, continuous inkjet, or the like. Print jobs that typically do not require high printing resolution include print jobs for commercial transactions such as bar code printing, bill & receipt printing, fax machines, cash register printing, automated teller machine (ATM) printing, or any other print jobs where the print quality is not a priority so long as the printed media is legible.

Figure 1:
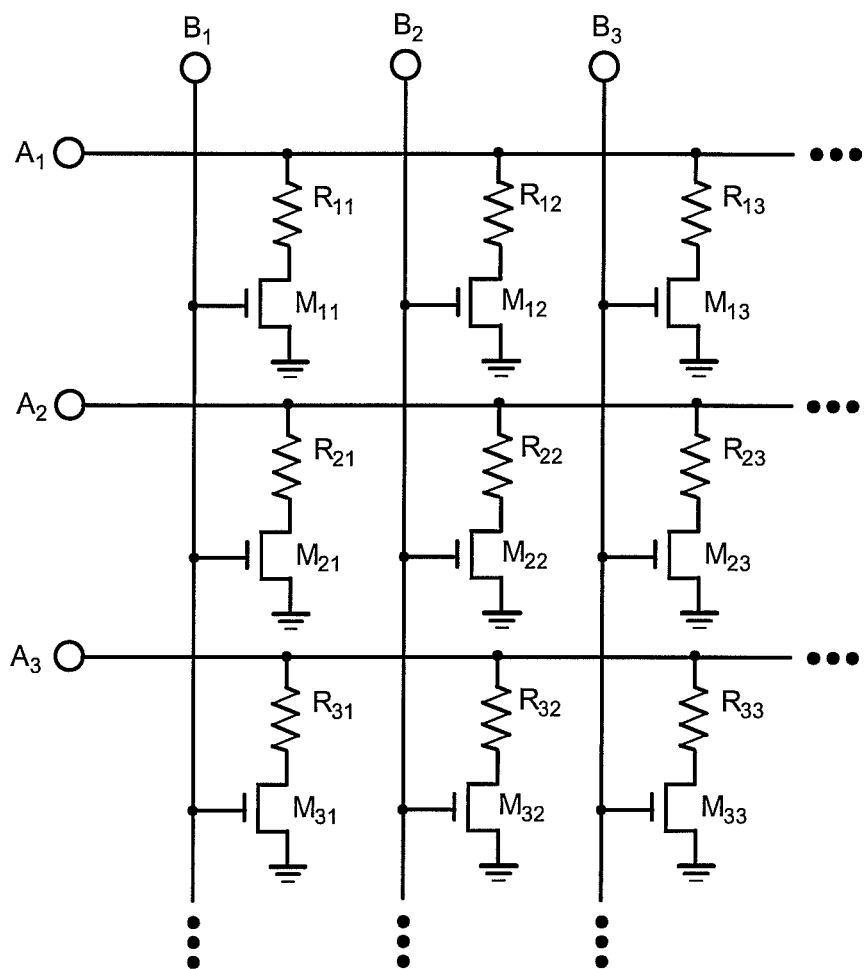
FIG. 1 illustrates a typical heater array used in a print head of an inkjet printer.
Figure 2:
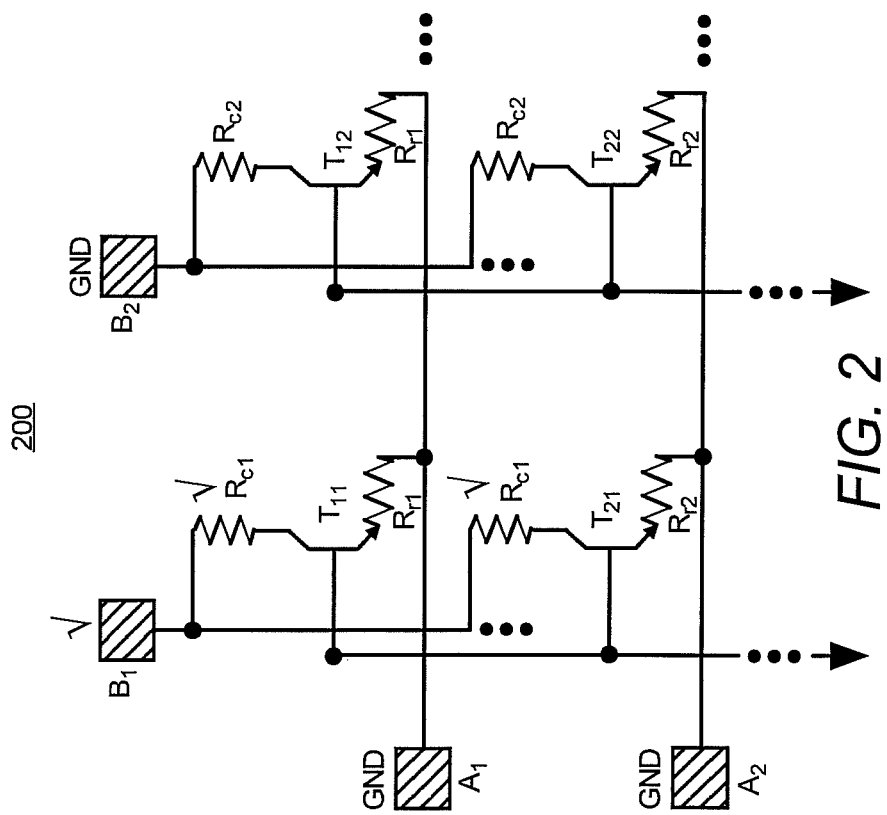
FIG. 2 illustrates a schematic diagram of a print head circuit of an inkjet printer, in accordance with one embodiment.

FIG. 2 illustrates a schematic diagram for a print head circuit 200 of an inkjet printer, in accordance with one embodiment. The print head circuit 200 includes multiple row select lines $A_1$ through $A_M$, wherein select lines $A_1$ and $A_2$ are shown, and multiple column select lines $B_1$ through $B_N$, wherein select lines $B_1$ and $B_2$ are shown. Spanning the row select lines are heating elements represented as resistors $R_{r1}$ through $R_{rM}$, wherein resistors $R_{r1}$ (across row 1) and resistors $R_{r2}$ (across row 2) are shown, in series with BJTs $T_{11}$ through $T_{MN}$, wherein $T_{11}$ through $T_{22}$ are shown. Spanning the column select lines are heating elements represented as resistors $R_{c1}$ through $R_{cN}$, wherein multiple resistors $R_{c1}$ (down column 1) and multiple resistors $R_{c2}$ (down column 2) are shown.

FIG. 2 shows an example of the lateral BJTs having a common base, i.e., a common base for each group of laterally-arranged BJTs (e.g., each row or column of BJTs). Also, in this example common bases are connected to ground. However, it should be understood that the common base for each column (or row) of BJTs is the same across the entire circuit. Also, the common base may be at any potential such that the BJTs act as forward-biased diodes in one direction when the column select lines $B_1$ through $B_M$ are energized and act as forward-biased diodes in the opposite direction when the row select lines $A_1$ through $A_N$ are energized. The resistors $R_{r1}$ across each row, for example, row 1, may be grouped together into multiple groups so that each group of resistors may be energized or fired up together. Likewise, the resistors $R_{c1}$ down each column, for example, column 1, may be grouped together into multiple groups so that each group of resistors may be energized or fired up together for faster printing. For example, as shown in FIG. 2, the two row resistors $R_{r1}$ may be grouped together, the two row resistors $R_{r2}$ may be grouped together, the two column resistors $R_{c1}$, may be grouped together, and the two column resistors $R_{c2}$ may be grouped together.

Described next is a firing sequence of the row and column select lines in the 2×2 matrix circuit 200, as illustrated in FIG. 2, to print a letter "I" with a particular halftoning process as exemplified in FIG. 3A. As understood in the art, because printers, including inkjet printers, cannot print continuous tones, a halftoning process is typically used in the printers to arrange a series of print dots in a specific pattern to simulate the look of a continuous tone image of the desired information to be printed. Any halftoning process may be used here.

As shown in FIG. 3A, the four dots as marked by the rectangle box may be printed by either 4 row resistors (2 resistors $R_{r1}$ and 2 resistors $R_{r2}$) or 4 column resistors (2 resistors $R_{c1}$ and 2 resistors $R_{c2}$) of the 2×2 matrix circuit 200 shown in FIG. 2 by applying voltage pulses at the respective row and column select lines sequentially. Thus, fast printing is provided through the firing in a predetermined order or arrangement of each group of resistors to effect printing of multiple ink drops at once, as individual resistor firing is not needed in printing applications that do not require high print quality. For example, the column select line $B_1$ is first energized with a voltage pulse (as indicated by a check mark) while the other row and column select lines are at absolute ground (GND), the current flows through the two resistors $R_{c1}$ in column 1 to effect the printing by the inkjet printer head of two ink drops in the first column of drops shown in FIG. 3A. No current flows through the other column resistors because their column select lines are not energized. No current flows through any of the row resistors $R_{r1}$ through $R_{rM}$ because their row select lines are not energized. Particularly, for the resistors $R_{r1}$, and $R_{r2}$ at column 1 where the column select line $B_1$ is energized, the transistors $T_{11}$ and $T_{21}$ appear as forward-biased diodes to allow current flowing through the column resistors $R_{c1}$ to the common base instead of to the resistors $R_{r1}$ and $R_{r2}$ at column 1 because the respective base to n+ junction diodes of $T_{11}$ and $T_{21}$ for $R_{r1}$ & $R_{r2}$ are not forwarded biased.

Next, the column select line $B_2$ is energized with a voltage pulse while the other row and column select lines are at GND, and the current will flow through the two resistors $R_{c2}$ in column 2 to effect the printing by the inkjet printer head of two ink drops in the second column of drops to complete the for dots identified by the rectangle box in FIG. 3. Again, no current flows through the other column resistors because their column select lines are not energized. Also, no current flows through any of the row resistors $R_{r1}$ through $R_{rM}$ because their row select lines are not energized. Particularly, for the resistors $R_{r1}$ and $R_{r2}$ at column 2 where the column select line $B_2$ is energized, the transistors $T_{12}$ and $T_{22}$ appear as forward-biased diodes to allow current flowing through the column resistors $R_{c2}$ to the common base rather than to the resistors $R_{r1}$ and $R_{r2}$ at column 2 because the diodes of $T_{12}$ and $T_{22}$ for $R_{r1}$ & $R_{r2}$ are not forward biased.

Figure 3B:
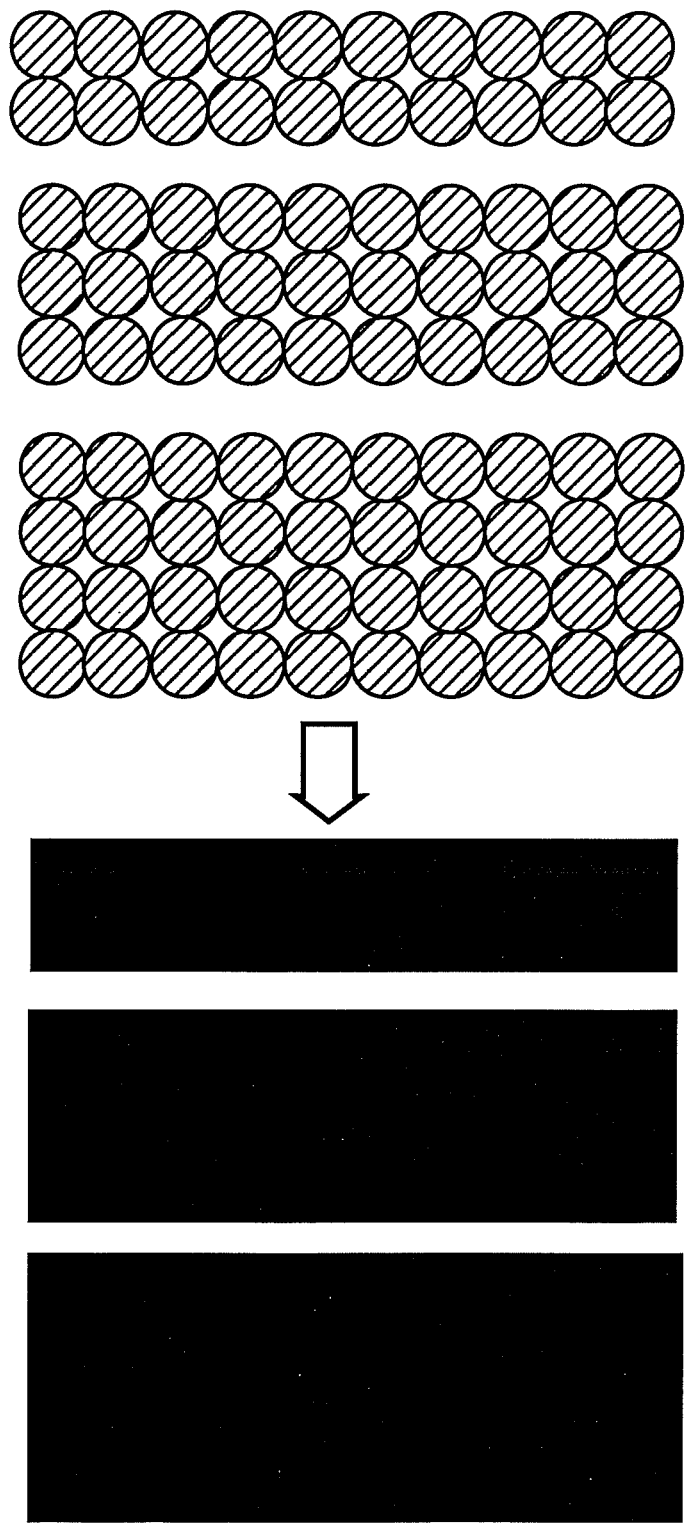

In similar ways, fast printing for other transactional print jobs, where print quality is not a priority, may be provided through the firing of each group of resistors at effect printing of multiple ink drops at once, as individual drop control is not needed. For example, as illustrated in FIG. 3B, bar code printing may be done by firing groups of one or more column resistors at once to effect printing of multiple ink drops (on the right side of the arrow), with desired halftoning algorithm to provide an optical appearance of bar codes (on the left side of the arrow).

FIGS. 4A-I illustrate the process steps for fabricating a BJT circuit, such as a BJT print head circuit with BJTs shown in cross sectional views, in accordance with one embodiment. For illustrative purposes only and not to be limiting thereof, the process steps are described in the context of the print head circuit 200.

Figure 4B:
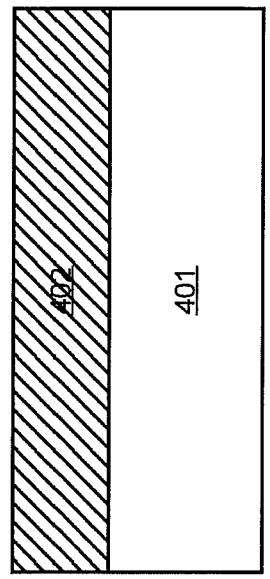
FIGS. 4A-I illustrate the process steps for fabricating a BJT circuit, in accordance with an embodiment.
Figure 4A:
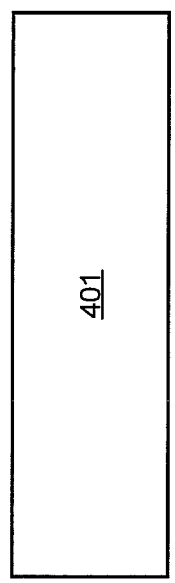

Referring now to FIG. 4A, the print head circuit 200 includes a semiconductor substrate 401, which may be a layer of silicon, such a silicon wafer, or of any suitable material. The choice of material is dependent upon the exact application in which the inkjet print head is used. In general, the substrate material may be chosen from materials typically used for fabricating common base lateral npn transistors, wherein the substrate 401 is the p-type layer, with additional consideration for thermal stability, ease of fabrication, cost, and durability.

Referring next to FIG. 4B, a thick insulation layer 402, such as a silicon dioxide ($SiO_2$) layer, is either grown or deposited on top of the substrate 401. The material and thickness of the insulation layer 402 is chosen such that it is sufficiently high to prevent inverting the underlying p-doped Si substrate 401.

Figure 4C:
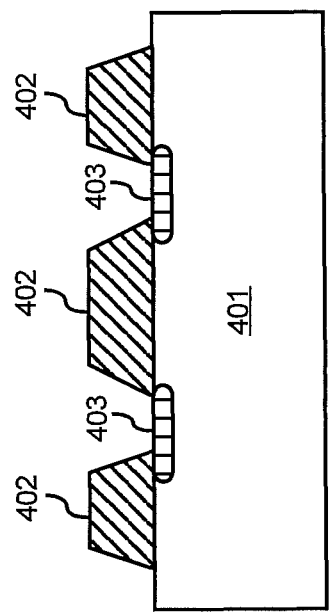

Referring next to FIG. 4C, a first mask is used to etch (e.g., dry etching) the insulation layer 402 in a desired pattern, so as to open up the insulation layer 402 to expose doping areas on the underlying substrate 401.

Figure 4D:
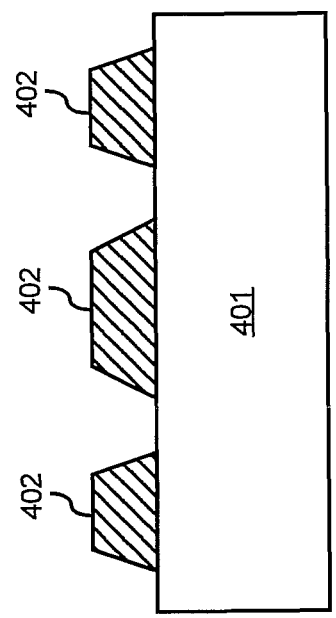

Referring next to FIG. 4D, based on the patterning by the first mask, the exposed areas of the substrate 401 are doped with a doping layer 403, such as a phosphorous layer, to form emitter and collector areas of the BJTs $T_{11}$ through $T_{MN}$. In general, the doping material is chosen so as to change the conductivity of the Si substrate 401 from a p-type to a n-type at the exposed emitter and collector areas.

Figure 4F:
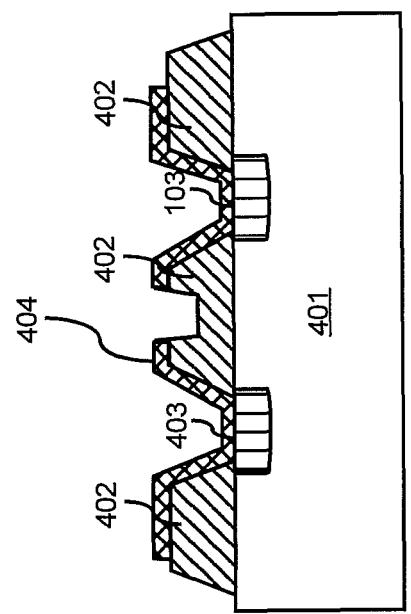
Figure 4E:
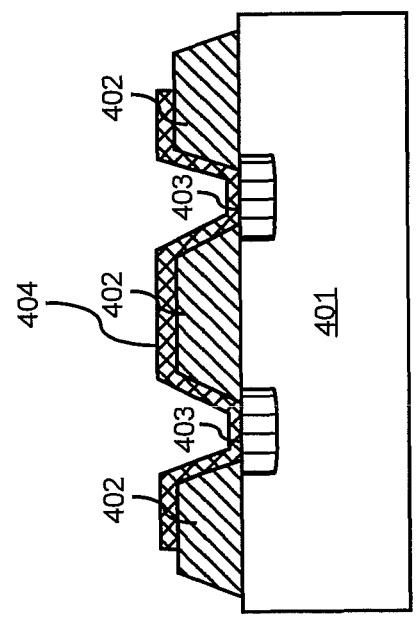

Referring next to FIG. 4E, a first metal layer 404 is deposited on the insulation layer 402 to form the resistors (inkjet heating elements) $R_{r1}$ through $R_{rM}$ and $R_{c1}$ through $R_{cN}$, the metal contacts for the emitter and collector areas of the BJTs $T_{11}$ through $T_{MN}$, and power carrier metal lines (i.e., row and column select lines). In the illustrated example, a Tantalum Aluminum (TaAl)/Aluminum Copper (AlCu) material is deposited to form power carrier metal lines, contacts to emitters/collectors, and inkjet resistors.

Referring next to FIG. 4F, a second mask is used to etch (e.g., dry etching) the first conductor layer at 404 (which includes, e.g., both TaAl and AlCu) to define the width of the inkjet resistors at 406 and power carrier metal lines at 404 for the BJTs. Because of good etch selectivity of the first conductor layer 404 with respect to the $SiO_2$ insulation layer 402, a dry over etch is done to remove some more $SiO_2$ at the base openings (as exposed by the second mask).

Figure 4H:
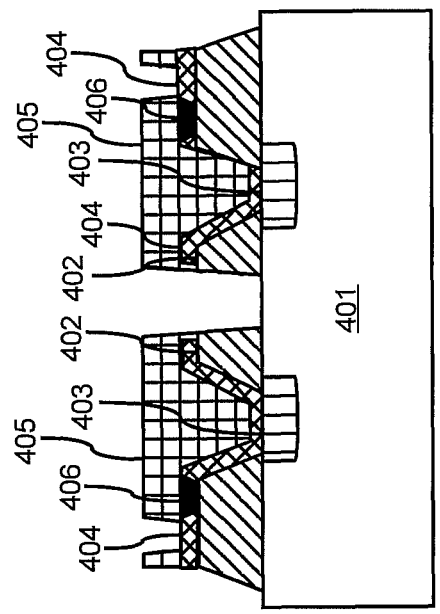
Figure 4G:
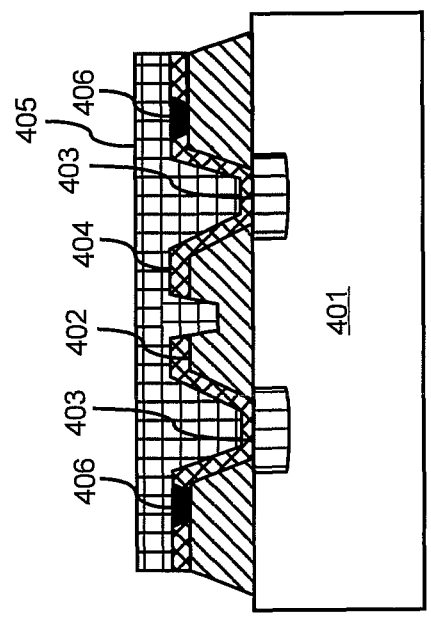

Referring next to FIG. 4G, a third mask is used to further etch (e.g., dry or wet etching) the first conductor layer 404 to define the length of the inkjet resistors at 406. And hence inkjet resistor is completely fabricated. Once this etching is completed, passivation layer 405 (another dielectric film) is deposited on the top of the etched areas of the first conductor layer 404 and the base openings. The passivation material is chosen so as to protect the first conductor layer 404 from reacting with any additional material to be deposited on top thereof.

Referring next to FIG. 4H, a fourth mask is used to etch openings or vias (e.g., by dry via etching) in the passivation layer 405 to create openings or accesses therein for connections to the conductor layer 404 below. The fourth mask is also used for further etching to clear away material at the base openings to form base contacts for the BJTs. In one embodiment, the materials of the insulation layer 402, the first conductor layer 404, and the passivation layer 405 are chosen to provide good etch selectivity so as to clear away those layers during etching to reach the underlying substrate 401 as desired.

Figure 4I:
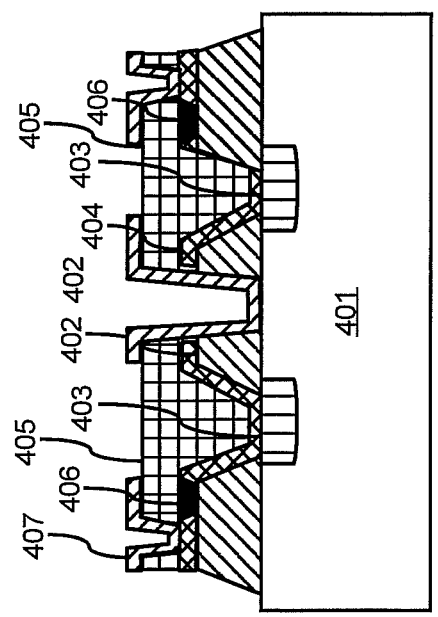

Referring next to FIG. 4I, a second conductor layer 407 is deposited on the passivation layer 405. A fifth mask is then used to etch the excess second conductor material 407 and this complete base contacts for BJTs $T_{11}$ through $T_{MN}$ and the connections to the first conductor layer 404 and this complete the fabrication of lateral BJTs & inkjet resistors. As a by-product of this process, a metal-insulator-metal (MIM) capacitor may be formed by the first and second conductor layers 404, 407 and the passivation layer 405 acting as a dielectric there between. The MIM capacitor may be used to store data to control specific functions of the print head. Accordingly, a common-base (common across $T_{11}$ to $T_{mn}$) lateral BJT print head circuit is fabricated from a 5-mask fabrication process, which enables cheaper and faster manufacturing of such a circuit.

Figure 5:
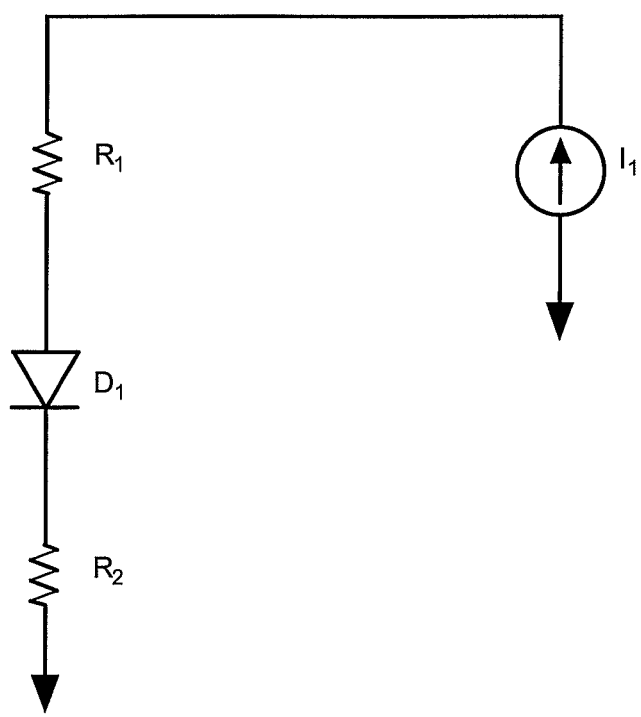
FIG. 5 illustrates a temperature measurement circuit, in accordance with one embodiment.

Alternative embodiments are contemplated wherein the 5-mask fabrication process may be used to fabricate any lateral BJT circuits that have common bases. For example, a temperature measurement or sensing circuit may be fabricated by the aforementioned 5-mask fabrication process based on a simple temperature dependent circuit, which is a p-n$^+$ junction diodes diode in series with loads represented by resistors or impedances $R_1$ and $R_2$, as illustrated in FIG. 5. A constant current source 1, will bring about a potential drop across the diode $D_1$, which will change with temperature. The diode $D_1$ becomes more conductive with increase in temperature. Thus, voltage drop may be measured across the diode $D_1$ for temperature prediction so as to control firing energy for the resistors.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A print head circuit of an inkjet printer comprising:
a plurality of row heating elements arranged in a plurality of rows;
a plurality of column heating elements arranged in a plurality of columns; and
a plurality of lateral bipolar junction transistors (BJTs), each lateral BJT is connected in between and in series with a corresponding one of the plurality of row heating elements and a corresponding one of the plurality of column heating elements, the plurality of lateral BJTs have common bases;
wherein the plurality of row heating elements and the plurality of column heating elements are selectively energized to heat ink in the inkjet printer in a desired pattern for printing media, and wherein each of the plurality of lateral BJTs operates to allow the corresponding row or column heating elements that are connected in series with the BJT to be energized.

2. The print head circuit of claim 1, wherein the common bases are connected to a common potential.

3. The print head circuit of claim 1, further comprising:
a plurality of row select lines, each row select line operates to energize a corresponding row of the plurality of heating elements at once; and
a plurality of column select lines, each column select line operates to energize a corresponding column of the plurality of heating elements at once.

4. The print head circuit of claim 3, wherein the plurality of row select lines are set to absolute ground potential when at least one of the plurality of column select lines is used to energize a corresponding column of the plurality of heating elements at once.

5. The print head circuit of claim 4, wherein the remaining ones of the plurality of column select lines are set to absolute ground potential.

6. The print head circuit of claim 3, wherein the plurality of column select lines are set at absolute ground when at least one of the plurality of row select lines is used to energize a corresponding row of the plurality of heating elements at once.

7. The print head circuit of claim 6, wherein the remaining ones of the plurality of row select lines are set to absolute ground potential.

8. The print head circuit of claim 3, wherein at least one of the BJTs operates as a forward-biased diode to allow current to flow through a corresponding one of the plurality of column heating elements connected thereto when a corresponding one of the column select lines is used to energize the corresponding one of the plurality of column heating elements.

9. The print head circuit of claim 3, wherein at least one of the BJTs operates as a forward-biased diode to allow current to flow through a corresponding one of the plurality of row heating elements connected thereto when a corresponding one of the row select lines is used to energize the corresponding one of the plurality of row heating elements.

10. The print head circuit of claim 1, wherein the inkjet printer operates to perform a print job for a commercial transaction that includes one of bar code print, bill and receipt printing, fax machine printing, and automated teller machine (ATM) printing.

* * * * *